United States Patent [19]

Nelson et al.

[11] Patent Number: 4,683,457
[45] Date of Patent: Jul. 28, 1987

[54] ANALOG TO DIGITAL CONVERTER

[75] Inventors: Robert G. Nelson, Dallas; James D. Awtrey, Garland, both of Tex.

[73] Assignee: Royalty Funding Ltd., Houston, Tex.

[21] Appl. No.: 857,028

[22] Filed: Apr. 29, 1986

Related U.S. Application Data

[63] Continuation-in-part of Ser. No. 566,314, Dec. 28, 1983.

[51] Int. Cl.$^4$ .................. A03K 13/20; G01P 15/08
[52] U.S. Cl. .................. 340/347 AD; 73/517 AV
[58] Field of Search ........... 340/347 AD; 73/517 AV

[56] References Cited

U.S. PATENT DOCUMENTS

| | | | |
|---|---|---|---|
| 2,985,018 | 5/1961 | Williams | 73/398 |
| 3,140,612 | 7/1964 | Houghton et al. | 73/398 |
| 3,151,487 | 10/1964 | Schuck | 73/517 |
| 3,185,942 | 5/1965 | White | 333/30 |
| 3,274,497 | 9/1966 | Zimmerman | 328/37 |
| 3,294,958 | 12/1966 | DuVall | 235/92 |
| 3,351,932 | 11/1967 | Hibbits | 340/347 AD |
| 3,440,645 | 4/1969 | Feigleson | 340/347 AD |
| 3,623,072 | 11/1971 | Pohlman | 340/347 AD |
| 3,868,677 | 2/1975 | Kidd | 340/347 AD |
| 3,896,299 | 7/1975 | Rhodes | 235/150.53 |
| 3,987,422 | 10/1976 | Yangidaira et al. | 340/207 P |
| 4,057,796 | 11/1977 | Hoogendoorn et al. | 340/347 AD |
| 4,300,135 | 11/1981 | Korn et al. | 340/690 |

FOREIGN PATENT DOCUMENTS 1938597  2/1971  Fed. Rep. of Germany .
2916103  10/1980  Fed. Rep. of Germany .

Primary Examiner—Bernard Roskoski
Attorney, Agent, or Firm—Kanz, Scherback & Timmons

[57] ABSTRACT

The disclosure is directed to an analog-digital converter which includes a source having an output of fixed frequency time-spaced pulses. An oscillator having an output of time-spaced pulses, harmonically related to pulses from the source, is comprised of a plurality of digital gates connected serially in a loop. At least one of the digital gates includes impedance means such as a resister or capacitor, responsive to an analog condition to form a modulator. Change in the value of the impedance changes the time constant of the modulator to effect a change in the time-spaced pulses related to the instantaneous amplitude of the analog condition. The outputs of the source and the oscillator are applied to a comparator. Means responsive to the comparator is employed to correct the oscillator time-spaced pulses toward an in phase state relative to the time-spaced pulses from the source. A digital signal is produced whose value is proportional to the correction made to the oscillator time-spaced pulses and is thus representative of the instantaneous value of the analog condition.

13 Claims, 5 Drawing Figures

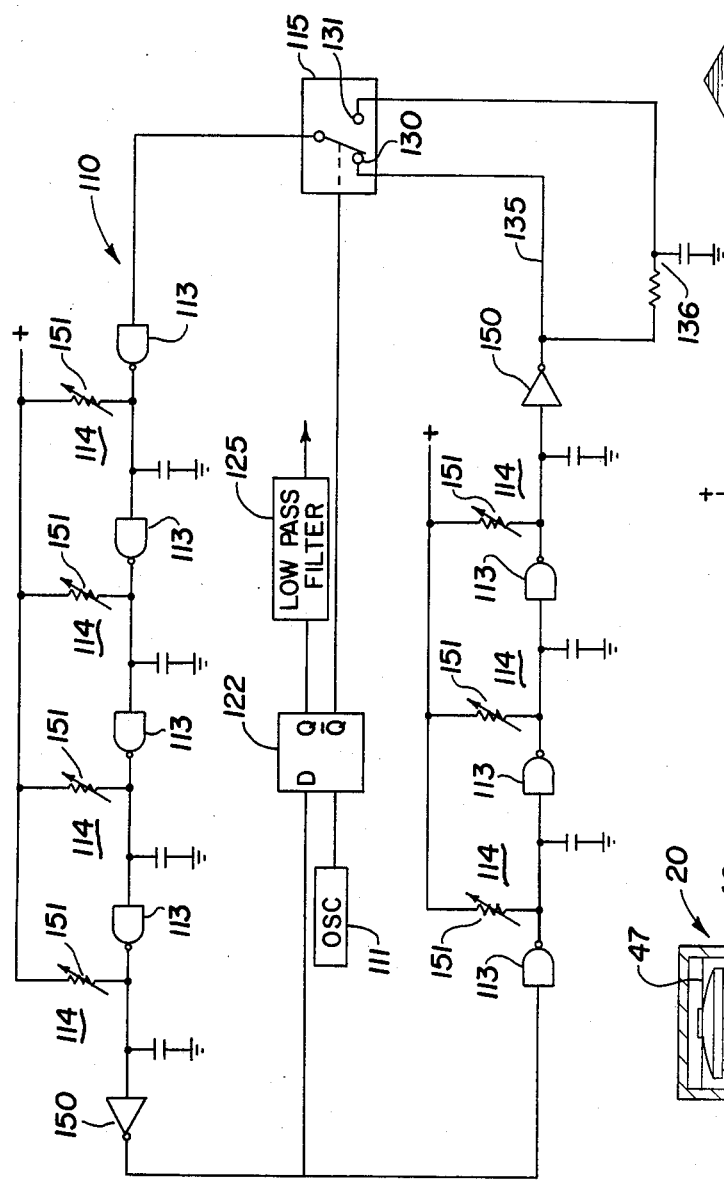
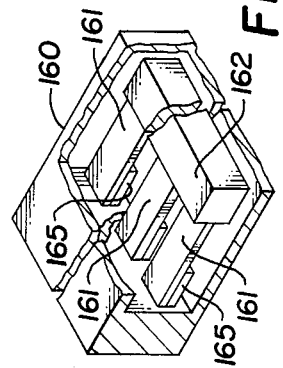
Fig. 5
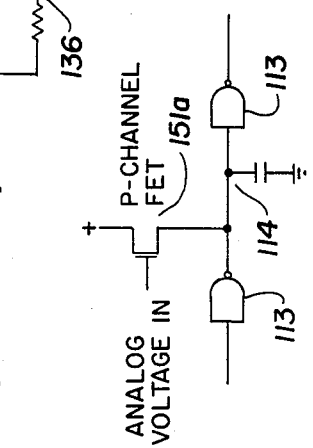
Fig. 4
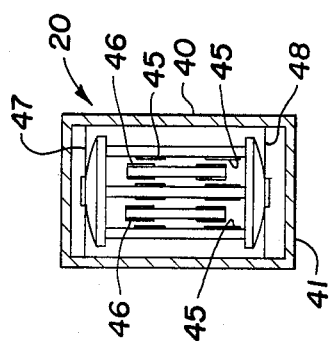
Fig. 2

ANALOG TO DIGITAL CONVERTER

CROSS-REFERENCE TO RELATED APPLICATION

This application is a continuation-in-part of Ser. No. 566,314 for "Methods and Apparatus for Analog to Digital Conversion" filed Dec. 28, 1983.

BACKGROUND OF THE INVENTION

1. Field of the Invention

This invention relates generally to a novel apparatus for analog to digital conversion utilizing two oscillators and a variable impedance associated with one of the oscillators, which is effective to change the phase of that oscillator in response to an analog condition.

2. Description of Prior Art

Conditions which can be measured, (e.g., temperature, voltage, pressure, weight, distance, velocity, capacitance, etc.) are often digitized so that the measure can be expressed as discrete steps or digits. The first step in digitizing often includes the use of a transducer, a device that will convert energy from one form to another. For example, a piezoelectric crystal can be used to convert pressure variations into an analog voltage and a thermister can be used to generate an analog voltage as a function of temperature. These voltages can then be digitized by an analog-digital converter. Other transducers, however, can more directly generate a digital output. For example, an interferometer can convert a displacement into a changing optical interference pattern that can then be converted into a pulsing, and hence digital, voltage by a photocell.

A popular form of analog-digital converter utilizes a ladder of matched resistors to divide either the input voltage or a reference voltage into a series of levels and arrive at a digitized or quantized representation of that voltage. When used in these devices, feedback is in the form of a voltage.

Voltage-to-frequency converters have a frequency output which is continuously variable. To be more useful, this output can be counted by a binary counter gated by a fixed clock or the output can be used to gate a fixed clock being used to drive a counter. Voltage-to-time converters such as integrators, can be used in a similar manner as a substitute for the voltage-to-frequency converters.

Another form of converter is the deltamodulator which generates a single weighed digital pulse train with the polarity of the pulses dependant upon a difference signal. This difference signal is created by subtracting the input voltage from the feedback voltage. The feedback voltage is generated by either a charge dispensing circuit or a digital-to-analog converter.

Yet another form of analog-digital converter represents a significant improvement over the analog-digital converters above described. This analog-digital converter is described in co-pending application filed by Robert G. Nelson on Dec. 28, 1983 bearing Ser. No. 566,314 and entitled "Methods and Apparatus for Analog-to-Digital Conversion". The analog-digital converter described therein employs two high-frequency oscillators having a digital output with the frequencies of the oscillators bearing a harmonic relationship one to the other. A representation of an analog condition is applied to cause a shift in phase in at least one of the digital signals. A comparator is then utilized to obtain a measure of the phase shift and the measure of phase shift is employed to adjust the phase of the phase shifted signal toward its original phase condition. The measure of phase shift results in a generation of a single weighed digital function representative of the amplitude of the adjustment utilized to return the phase shifted signal towards its original phase shifted condition. The single weighed digital function is applied to a low-pass digital filter to produce a multi-bit digital word representative of the instantaneous value of the analog condition.

SUMMARY OF THE INVENTION

In accordance with the present invention an analog-digital converter includes a source having an output of fixed frequency time-spaced pulses. An oscillator having an output of time-spaced pulses, harmonically related to pulses from the source, is comprised of a plurality of digital gates connected serially in a loop. At least one of the digital gates includes impedance means responsive to an analog condition to form a modulator. Change in the value of the impedance changes the time constant of the modulator to effect a change in the time-spaced pulses related to the instantaneous amplitude of the analog condition. The outputs of the source and the oscillator are applied to a comparator. Means responsive to the comparator is employed to correct the oscillator time-spaced pulses toward an in phase state relative to the time-spaced pulses from the source. A digital signal is produced whose value is proportional to the correction made to the oscillator time-spaced pulses and is thus representative of the instantaneous value of the analog condition. In a preferred embodiment of the invention the oscillator is a ring oscillator.

In one species the impedance is resistance in an R-C network which is varied in response to the analog condition to change the phase of the oscillator time-spaced pulses. In another specie, the impedance is a capacitor in an R-C network which is variable and responds to the analog condition to change the phase of the oscillator time-spaced pulses.

The analog-digital converters of the present invention have application in many areas. One of them being as a geophone in which case the capacitance is represented by a capacitor comprised of at least one fixed plate and at least one moveable plate located adjacent the fixed plate. The moveable plate is mounted on a resilient means and moves in response to mechanical vibrations, for example, seismic vibrations to vary the value of the capacitor to effect a change in the phase of the oscillator time-spaced pulses.

A variable resistor embodiment of the present invention may also be used in the analog-digital conversion of mechanical vibrations such as seismic vibrations. To that end there is described a resistive strain element mounted on a cantilevered arm. A mass is mounted on the free end of the arm so that the mechanical vibration will cause flexing of the resistive element to effect a change in the resistance value and thereby cause a change in the phase of the oscillator time-spaced pulses.

The present invention is also applicable to the conversion of analog electrical signals. In this embodiment the variable resistance is provided by a field effect transistor whose effective resistance is a function of the analog voltage being applied to the gate of the transistor which in turn causes its channel resistance to vary. This in effect will cause a change in the phase of the oscillator time-spaced pulses and produce digital signals representative of the instantaneous value of the analog electrical signal.

The advantages of the present invention will be realized from the following description of the various species described in conjunction with the following drawings.

BRIEF DESCRIPTION OF THE DRAWINGS

FIG. 2 is a side elevation view of a variable capacitance for the specie of FIG. 1 and useful as a detector of seismic vibrations.

FIG. 3 is a schematic of another specie of the present invention wherein the phase of an oscillator is effected by a variable resistance.

FIG. 4 is a schematic illustrating the use of a field effect transistor as a variable resistance in the specie of FIG. 3.

FIG. 5 is a perspective view, partly in section, of a mechanical vibration detector including strain elements providing resistance useful in the specie of FIG. 3.

DETAILED DESCRIPTION

Figure 1:
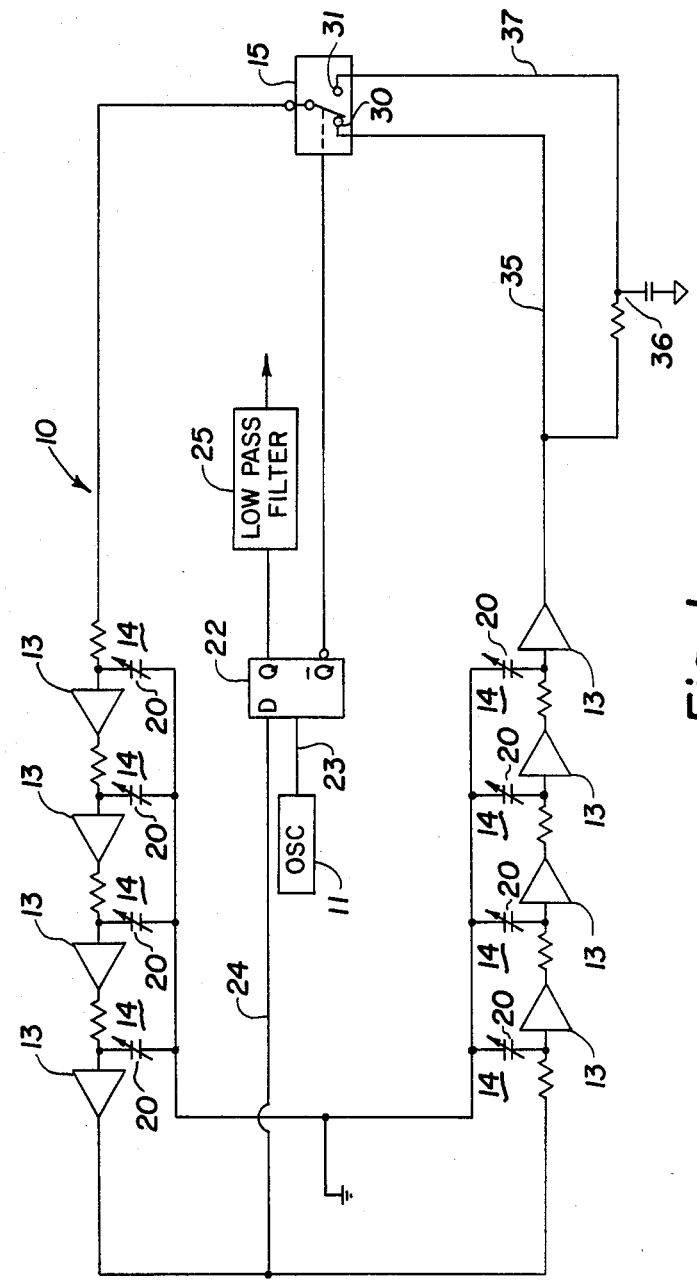
FIG. 1 is a schematic diagram of an analog-digital converter embodying the present invention where the phase of an oscillator is affected by a variable capacitance.

Referring now to FIG. 1 there is illustrated an analog-digital converter which, in accordance with the present invention, is comprised of an oscillator 10 and an oscillator 11. The oscillator 11 produces high frequency pulses at a fixed rate and can be represented by what is known in the art as a clock.

The oscillator 10, a ring oscillator, is comprised of a series of modulators formed by digital gates 13 each having associated therewith an impedance represented by a resistance capacitance network 14. The gates 13 are shown connected in loop with a selector means 15 which also includes the function of an inverting gate. With the gates 13 shown as non-inverting gates the oscillator loop thus includes an odd number of inverting gates, namely the inverting gate provided by the selector means 15. The odd number of inversion results in an unstable state in which a voltage transition from a high state to a low state will propagate around the loop until it reaches the inverting gate 15, then propagate as the transition from a low state to a high state. This single transition, high-to-low or low-to-high edge will continuously propagate around the loop. It will be understood that while each of the gates 13 has been shown as a non-inverting gate, a number of them may be inverting gates so long as there is satisfied in the circuit of FIG. 1 that the loop include an odd number of inverting gates.

In one embodiment the oscillator frequencies were 250 kilo hertz. Typically the oscillators should run at from 100 to 1000 times the highest analog frequency of interest.

The oscillator or ring oscillator 10 is designed to run at a frequency approximately equal to the reference frequency of the pulses from the oscillator 11.

Each of the resistance capacitance networks 14 includes a variable capacitor 20. Variations in the value of the capacitors 14 will modulate the time constants of the delay networks 14 and thereby modulate the time it takes for a voltage transition or edge to propagate from one digital gate to the next and thereby cause a change in the frequency and/or phase of the pulse or edge propagating around the loop of the ring oscillator 10.

A comparator flip-flop 22 also known as a D-flip-flop, is utilized to compare the output from the oscillator 11, applied to the comparator by a conductor 23, with the output of the ring oscillator 10 applied to the D input of the comparator 22 by way of conductor 24. The net result is an output signal from the comparator 22 which is proportional to the phase difference between the propagating edge of the pulse of the ring oscillator 10 and the propagating edge of the pulse from the oscillator 11. Now if we consider that the variation of the capacitor is a function of an analog condition that is hereinafter described, the output of the comparator 22 will be a series of single weighed digital pulses which when applied to a low pass filter 25 will result in a multi-bit binary word. That multi-bit binary word will be representative of the instantaneous value of the analog condition. Stating the forgoing another way, if the voltage transition of the ring oscillator 10 from a low-to-high state as represented at the D input to the comparator flip-flop 22 is early with respect to the low-to-high transition of the clock or oscillator 11 then a high level 1 will appear at the Q output of the comparator flip-flop 22 and a delay decision will be applied to the selector means 15 which is connected in series in the oscillator loop.

The selector means 15 has two inputs 30 and 31. The input 30 is directly connected in the loop of the oscillator 10 by way of conductor 35 and is called the no delay input. The input 31 of the selector means 15 is connected to the loop of the oscillator 10 by way of an RC delay network 36 by way of conductor 37 and can be called the delay input. When a delay decision is selected, the low-to-high voltage transition in the loop propagates by way of the delay network 36 and delay input 31 of the selector and thus continue around the loop. This delay provides a correction to the frequency or phase of the oscillator 10 so that the low-to-high voltage transition of the loops edge as seen at the D input of the comparator 22 stays within a certain time window referenced to the output of the oscillator 11.

The delay introduced per modulator stage is approximately 250 nanoseconds. This, for a 250 kilo hertz oscillator, is about 1/16th of the loop period per stage. More specifically, 4 microseconds divided by 8 stages and 2 edges per cycle. The delay introduced by network 36 is approximately 500 nanoseconds for a 250 kilo hertz oscillator. The general criteria to assure that oscillator 10 remains locked with clock 11 for a frequency of 250 kilo hertz is as follows:

the sum of no delay at path 35 and maximum delay at the gates should be less than 4 microseconds while the sum of the delay in network 36 and minimum delays at the gates should be greater than 4 microseconds.

On the other hand, if the low-to-high transition of the loops edge is late with respect to the low-to-high transition of the output of oscillator 11 as seen by the comparator flip-flop 22 then a no-delay decision will be applied to the selector 15 and when the low-to-high transition in the loop reaches the delay no-delay decision point the selector 15 will be connected to the no-delay input and the transition will continue around the loop. Thus the comparator flip-flop 22 is utilized to detect if the ring oscillator 10 is running faster or slower than the oscillator 11 and the decisions made by the comparator flip-flop 22 are applied to the selector 15 to provide an adjustment or a fixed time step adjustment to the ring oscillator's natural running frequency.

The output of the comparator flip-flop 22 has a single binary value for every pulse received from the oscillator 11. This signal is processed by a decimating digital low pass filter 25 in which binary ones and zeros are multiplied with the finite impulse response filter coefficient of the filter to provide a multi-bit binary word at a lower sample rate. This binary word is similar to the type of binary words provided by prior art analog-digital converters. Digital filters are described in "Digital Filters" by R. W. Hamming, 2nd Edition published by Prentice Hall, 1983.

Each of the capacitors 20 may take the form of a mechanical vibration sensor as shown in FIG. 2. When the mechanical vibration is seismic energy the capacitors 20 provide the function of a non-inductive geophone. The capacitors 20 are included in a housing 40 the base 41 of which can be coupled to the earth. Within the housing 40 are mounted a plurality of moveable capacitor plates 45 supported by resilient means or springs 47 and 48. The plates 45 are suspended between and parallel with fixed capacitor plates 46 secured to the housing 40. When the housing is moved by seismic energy, motion is induced between the two sets of capacitor plates 45, 46. The moveable capacitor plates 45 are connected together to electrical ground whereas the stationary capacitor plates 46 have individual connections brought out to provide the capacitive elements of the networks 14. FIG. 2 has been simplified and thus only illustrates two sets of capacitor plates. It will be understood that the number of capacitor plates can be increased to match the number of capacitors necessary for the selected number of delay networks to be employed in the ring oscillator 10. It is understood that only one of the networks 14 need include a variable capacitor.

Each capacitor plate 45, 46 contains several conductive areas. The conductive area of each moveable plate 45 forms a capacitor with the adjacent conductive area of a fixed plate 46. Motion of the housing 40 will result in the change in the overlapping area of the capacitor plates and thus effect a change in the value of the capacitance. Each of the plates comprising the capacitive geophone may be formed from plastic or ceramic material with a conductive layer of appropriate geometry screened or plated onto the surface of each plate.

Seismic energy will cause the fixed capacitor plates to move with respect to the suspended capacitor plates. The result is that the time delay networks 14 are modulated by motion of the earth. This results in a modulation in the time it takes for the voltage transition or edge to propagate from one digital gate 13 to the next. Accordingly, there is provided in a relatively simple form, a direct method of converting the displacement of the earth to a change in phase or frequency in which the voltage transition circulates around the loop.

When the capacitor plates are displaced near a maximum level in one direction because of the earths motion there will be more delay decisions than no-delay decisions and when the capacitor plates are further in the opposite direction because of the earths motion there will be more no-delay decisions than delay decisions. The result is that the delay/no-delay decisions become a measure of the probability of the instantaneous displacement of the moving earth. With the analog-digital converter FIG. 1 including the capacitor arrangement of FIG. 2 there results a digital geophone design which directly converts the earths motion into a varying capacitance which in turn is converted into a digital signal processed by the low pass or digital filter 25 to provide a binary digital representation of the motion of the earth.

In one embodiment of the invention the following elements, all available from Texas Instruments, were employed:
gates 13—SN74HC244N
selector 15—SN74HC158N
comparator 22—SN74HC74N Another specie of the present invention is illustrated in FIG. 3 as an analog-digital converter comprised of two oscillators 110 and 111. The oscillator 111 is a digital pulse oscillator otherwise known as a clock and similar in characteristics and function to the oscillator 11 of FIG. 1. The oscillator 110 is a variable frequency or variable phase oscillator comprised of an odd number of inverting gates comprised of gates 113 and gates 150. All the gates 113 and 150 are connected in series with each other and with selector means 115 which is similar in function to the selector means 15 of FIG. 1. The selector means 115 of FIG. 3 however has a non-inverting characteristic. The specie of FIG. 3 includes resistance-capacitance networks 114 associated with each of the inverting gates 113 to provide a plurality of modulators. Each of the resistance-capacitive networks 114 provides a variable delay function with the variation being provided by variable resistors 151. In the particular embodiment illustrated the digital gates 113 are chosen to have open drain outputs such that the resistors 114 serve as pull-ups to the gates output transistors.

The inverting gates 150 serve as buffer drivers to prevent loading on a previous RC stage including gate 113.

As aforesaid, the loop of the oscillator 110 includes an odd number of inverting gates and thus forms a ring oscillator. The odd inversion results in an unstable state in which a voltage transition from high state to low state will propagate around the loop until it reaches an inverting gate, then propagate as a transition from a low state to a high state. This transition high-to-low or low-to-high edge will continuously propagate around the loop of the oscillator 110. Each of the resistances 151 is responsive to an analog condition such that the resistance capacitive time delay networks 114 are modulated by the analog condition. This results in a modulation to the time it takes for the voltage transition or edge to propagate from one digital gate to the next. The result is a direct technique of converting an analog condition to a change in frequency with which the voltage transition circulates around the loop.

The ring oscillator 110 is designed to run at the frequency which is equal to or harmonically related to the reference frequency of the oscillator 111. The minimum frequency of the oscillators should be about 100 to 1000 times the analog frequency of interest. Since the variation in resistance converts an analog condition to a time delay there is included in FIG. 3 a phase comparator or comparator flip-flop 122 which measures whether or not the voltage transition is propagating around the loop of the ring oscillator 110 at rate faster or slower than the frequency of the pulses from the reference oscillator 111. If the ring oscillator voltage transition from low-to-high state as measured at the D input of the comparator 122 is early with respect to the low-to-high transition of the oscillator 111 then a high level or one will appear at the Q output of the comparator flip-flop 122 and a delay decision will be applied to the selector 115 which is connected in series with the gates 113 and 150. Like the selector 15 of FIG. 1 the selector 115 includes two inputs 130 and 131 respectively called the no-delay and delay inputs. When a delay decision is selected, the low-to-high voltage transition in the loop propagates to the delay input 131 by way of delay network 136 and then continues by way of the selector means 115 around the loop of the oscillator 110. This delay provides a correction to the frequency of the ring oscillator such that the low-to-high voltage transition of the loops edge as seen at the D input of the comparator flip-flop 122 stays within a certain time window referenced to the frequency of the pulses from oscillator 111.

If the low-to-high transition of the loops edge is late with respect to the low-to-high transition of a pulse from the oscillator 111 as seen by the comparator flip-flop 122 then a no-delay decision will be applied to the selector 115 so that when the low-to-high transition of the pulse reaches the networks leading to the input of the selector 115 the selector will cause the transition to be applied to input 130 by way of conductor 135 and the transition will then propagate without delay through the selector 115 and continue to around the loop of the oscillator 110. Thus the comparator flip-flop 122 is used to detect if the oscillator 110 is running faster or slower than oscillator 111 and the decisions made by the comparator flip-flop 122 are applied to the selector 115 to provide an adjustment to the natural running frequency of the oscillator 110.

When the resistors 151 are near a minimum value because of the analog condition, there will be more delay decisions than no-delay decisions and when the resistors are near maximum value there will be more no-delay decisions than delay decisions. The result will be that the decisions will be a measure of the probability of the instantaneous value of the analog condition.

The output of the comparator flip-flop 122 has a single binary value for each pulse from the oscillator 111. This single binary signal is processed by a decimating digital low pass filter 125 in which binary ones and zeros are multiplied with the finite impulse response filter co-efficient of the filter to provide a multi-bit binary word at a lower sample rate.

As thus far described the analog-digital converter of FIG. 3 provides a means for converting an analog condition into a varying resistance which in turn is converted into a digital signal which when processed by the decimating digital low pass filter provides binary digital representation of the analog condition.

One technique for varying the resistance 151 in response to an analog voltage is illustrated in FIG. 4 where the variable resistance 151 is represented by a P-Channel Field Effect transister 151a. FIG. 4 represents but one resistance-capacitance stage 114 of the series of stages 114 illustrated in FIG. 3. A varying analog voltage is applied to the gate of the Field Effect transister 151a to cause the channel resistance to vary. Thus an analog condition, a voltage is converted into a varying resistance which in turn can be converted by way of the analog-digital converter of FIG. 3 to a digital signal representative of the analog condition.

The number of variable resistance stages in the ring oscillator 110 is a direct function of the desirablity of sensitivity. The greater the sensitivity desired the more stages will be included so long as the criteria of an odd number of inverting stages is followed in order to preserve the operating characteristics of a ring oscillator.

The resistors 151 may be responsive to mechanical vibration Such an arrangement is illustrated in FIG. 5 as comprising a housing 160 containing a plurality of cantilever arms 161 whose free ends are secured to an inertial mass 162. Mounted to the underside of each cantilever arm 161 near the respective junctures to the housing 160 are a plurality of piezo-resistive elements 165. If the housing 160 is coupled to the earth the assembly will function as a geophone in that seismic energy will cause the housing 160 to move in relation to the inertial mass 162 to flex the cantilevered arms 161 to which the resistive strain elements 165 are attached. The resistance of the elements 165 at any point in time will be directly proportional to the amount of deflection or flexing applied to the cantilever arms. The result will be a modulation of the resistance-capacitance delay networks 114 of FIG. 3 by the motion of the earth. This in turn results in a modulation to the time it takes for a voltage transition or edge to propagate from one digital gate 113 to the next. Accordingly, the displacement of the earth is converted to a change in the frequency in which the voltage transition circulates around the loop of the ring oscillator resulting in the production of a digital signal which when processed by the digital filter 125 provides a binary representation of the motion of the earth.

Other instrumentalities may be utilized with the analog-digital converter of FIG. 3 having a resistance whose value is a function of an analog condition. For example, the pull-up resistance can be a photo-resistor or a photo-transistor to obtain a varying resistance representing the instantaneous value of light intensity. On the other hand, the pull-up resistance can be a temperature sensitive resistor to obtain a representation of the instantaneous value of temperature. Likewise other instrumentalities may immediately come to mind of those skilled in the art concerning apparatus for converting an analog condition to a varying resistance to take advantage of the analog-digital conversion characteristics of the system of FIG. 3.

What is claimed is:

1. An analog to digital converter comprising;
   a source having an output of fixed frequency time spaced pulses,
   means, including an oscillator comprised of a plurality of digital gates connected serially in a loop, and having an output of time-spaced pulses whose frequency is harmonically related to the output frequency of said source,
   an impedance in said loop responsive to an analog condition to change the phase of said time-spaced pulses from said means,
   a comparator,
   means for applying the outputs of said source and said means to said comparator,
   means responsive to said comparator to correct said time-spaced pulses from said means to an in-phase state relative to the time spaced pulses from said source, and
   means for producing digital signals whose value is proportional to the correction made to said time-spaced pulses from said means.

2. The analog to digital converter of claim 1 in which said oscillator is a ring oscillator.

3. The analog to digital converter of claim 1 in which said impedance is provided by a resistance-capacitance network.

4. The analog to digital converter of claim 3 including means for varying the resistance of said network in response to the analog condition to change the phase of said time-spaced pulses from said means.

5. The analog to digital converter of claim 3 including means for varying the capacitance of said network in response to the analog condition to change the phase of said time-spaced pulses from said means.

6. The analog to digital converter of claim 4 in which said resistance is provided by a resistive strain element.

7. The analog to digital converter of claim 4 in which said resistance is provided by a field effect transistor.

8. The analog to digital converter of claim 7 in which said field effect transistor responds to a voltage representative of said analog condition to change resistance in a network to change the phase of said time-spaced pulses from said means.

9. The analog to digital converter of claim 6 in which said resistive strain element is mounted on a cantilevered arm, and
   a mass mounted on a free end of said arm whereby a mechanical vibratory analog condition will cause flexing of each resistive strain element to effect a change in the phase of said oscillator time-spaced pulses.

10. The analaog to digital converter of claim 5 in which said capacitance is provided by a capacitor comprised of at least one fixed plate and at least one moveable plate located adjacent said fixed plate,
    resilient means,
    said moveable plate being mounted to said resilient means and moveable in response to mechanical vibration representing said analog condition to vary the value of said capacitor to effect a change in the phase of said time-spaced pulses from said means.

11. The analog to digital converter of claim 1 in which said digital signals are single weighed digital functions.

12. The analog to digital converter of claim 11 including a decimating digital low-pass filter and means for applying said single weighed digital function to said low-pass filter to produce multi-bit binary words at a lower sample rate.

13. The analog to digital converter of claim 1 in which said digital signals are digital words.

* * * * *